United States Patent
Cheng et al.

(10) Patent No.: US 10,950,505 B2
(45) Date of Patent: Mar. 16, 2021

(54) MULTIPLE FINFET FORMATION WITH EPITAXY SEPARATION

(71) Applicant: International Business Machines Corporation, Armonk, NY (US)

(72) Inventors: Kangguo Cheng, Schenectady, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 15/412,625

(22) Filed: Jan. 23, 2017

(65) Prior Publication Data

US 2018/0211880 A1     Jul. 26, 2018

(51) Int. Cl.
| | |
|---|---|
| *H01L 29/78* | (2006.01) |
| *H01L 29/66* | (2006.01) |
| *H01L 21/8234* | (2006.01) |
| *H01L 29/06* | (2006.01) |

(52) U.S. Cl.
CPC ......... *H01L 21/823431* (2013.01); *H01L 21/823481* (2013.01); *H01L 29/0649* (2013.01); *H01L 29/66795* (2013.01)

(58) Field of Classification Search
CPC ................................. H01L 29/78; H01L 29/66
See application file for complete search history.

(56) References Cited

U.S. PATENT DOCUMENTS

| | | | |
|---|---|---|---|
| 8,647,987 B2 | 2/2014 | Yang et al. | |
| 8,652,889 B2 | 2/2014 | Wei et al. | |
| 9,048,260 B2 | 6/2015 | Jhaveri et al. | |
| 9,093,496 B2 | 7/2015 | Jacob et al. | |
| 9,269,815 B2 | 2/2016 | Cai et al. | |
| 9,318,367 B2 | 4/2016 | Huang et al. | |
| 2010/0015778 A1* | 1/2010 | Lin | H01L 21/76232 438/443 |
| 2013/0005103 A1 | 1/2013 | Liu et al. | |
| 2013/0161756 A1 | 6/2013 | Glass et al. | |
| 2014/0191296 A1* | 7/2014 | Bergendahl | H01L 29/7855 257/288 |
| 2014/0306297 A1* | 10/2014 | Ching | H01L 29/66795 257/401 |
| 2014/0306317 A1 | 10/2014 | Licausi | |
| 2014/0327088 A1* | 11/2014 | Cai | H01L 29/785 257/401 |
| 2015/0021710 A1 | 1/2015 | Hsu et al. | |

* cited by examiner

*Primary Examiner* — Joseph C. Nicely
*Assistant Examiner* — Lamont B Koo
(74) *Attorney, Agent, or Firm* — Cantor Colburn LLP; Robert Sullivan

(57) ABSTRACT

A method for forming a semiconductor device includes: forming a plurality of fins from a substrate; removing at least one fin to form at least a first group of fins; conformally depositing a first insulating material layer on the first group of fins and the substrate; forming a second insulator over the first insulating material layer; removing the second insulator to reveal the tops of the first group of fins; removing the first insulating material layer between the fins and the second insulating material; forming a dielectric layer over the fins; and forming a work function metal over the dielectric layer.

10 Claims, 10 Drawing Sheets

FIG. 7a

MULTIPLE FINFET FORMATION WITH EPITAXY SEPARATION

BACKGROUND

The present invention relates in general to semiconductor device fabrication methods and resulting structures. More specifically, the present invention relates to fabrication methods and resulting structures for fins of a fin-type field effect transistor (finFET).

In contemporary semiconductor device fabrication processes, a large number of semiconductor devices, such as fin field effect transistors (finFETs), are fabricated in and on a single wafer. FinFETs employ semiconductor fins to introduce on-wafer topography. The semiconductor fins are often formed as an array of semiconductor fins having a periodicity, or fin pitch, to minimize etch bias due to pattern factor, i.e., the fraction of the area of the semiconductor fins within a unit area. In this case, some of the semiconductor fins need to be made with a smaller fin pitch as the size of complementary metal-oxide-semiconductor (CMOS) devices become smaller.

Shallow trench isolation (STI) is a semiconductor circuit feature that prevents leakage between semiconductor devices such as finFETs. Fins cut in hardmask is one way to approach one-time STI for CMOS to avoid STI variation. However, making such cuts can be difficult due to different STI loading presented per design and layout. Further, good STI recess uniformity is difficult to control due to different STI loading, and active fin channel height cannot be controlled very well due to imperfect STI recess uniformity.

SUMMARY

According to one or more embodiments of the present invention, a method for forming a semiconductor device is described. The method includes: forming a plurality of fins from a substrate; removing at least one fin to form at least a first group of fins; conformally depositing a first insulating material layer on the first group of fins and the substrate; forming a second insulator over the first insulating material layer; removing the second insulator to reveal the tops of the first group of fins; removing the first insulating material layer between the fins and the second insulating material; forming a dielectric layer over the fins; and forming a work function metal over the dielectric layer.

According to one or more embodiments of the present invention a method for forming a gate of a fin Field Effect Transistor (finFET) is described. The method includes: forming a plurality of fins from a substrate; removing at least one fin to form at least a first group of fins; conformally depositing a first insulating material layer on the first group of fins and the substrate; forming a second insulating material layer over the first insulating material layer; removing a portion of the second insulating material layer to reveal the tops of the first group of fins; removing the first insulating material between the fins and the second insulating material; forming a dielectric layer over the fins; and forming a work function metal over the dielectric layer.

According to one or more embodiments of the present invention a semiconductor device is described. The device includes a first insulating material layer, a second insulating material and a gate. The device also includes a substrate having fins extending upwardly through the first insulating material and between portions of the second insulating material, a high-k dielectric deposited on the fins and a work function metal deposited over the high-k dielectric.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 6b shows a side view of a structure of FIG. 5 after the top of the first insulating material has been lowered to a lower level than was shown in FIG. 6a;

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique.

Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, embodiments described herein provide a manner to form a shallow trench isolator that easily exposes fins for further processing.

Figure 1:
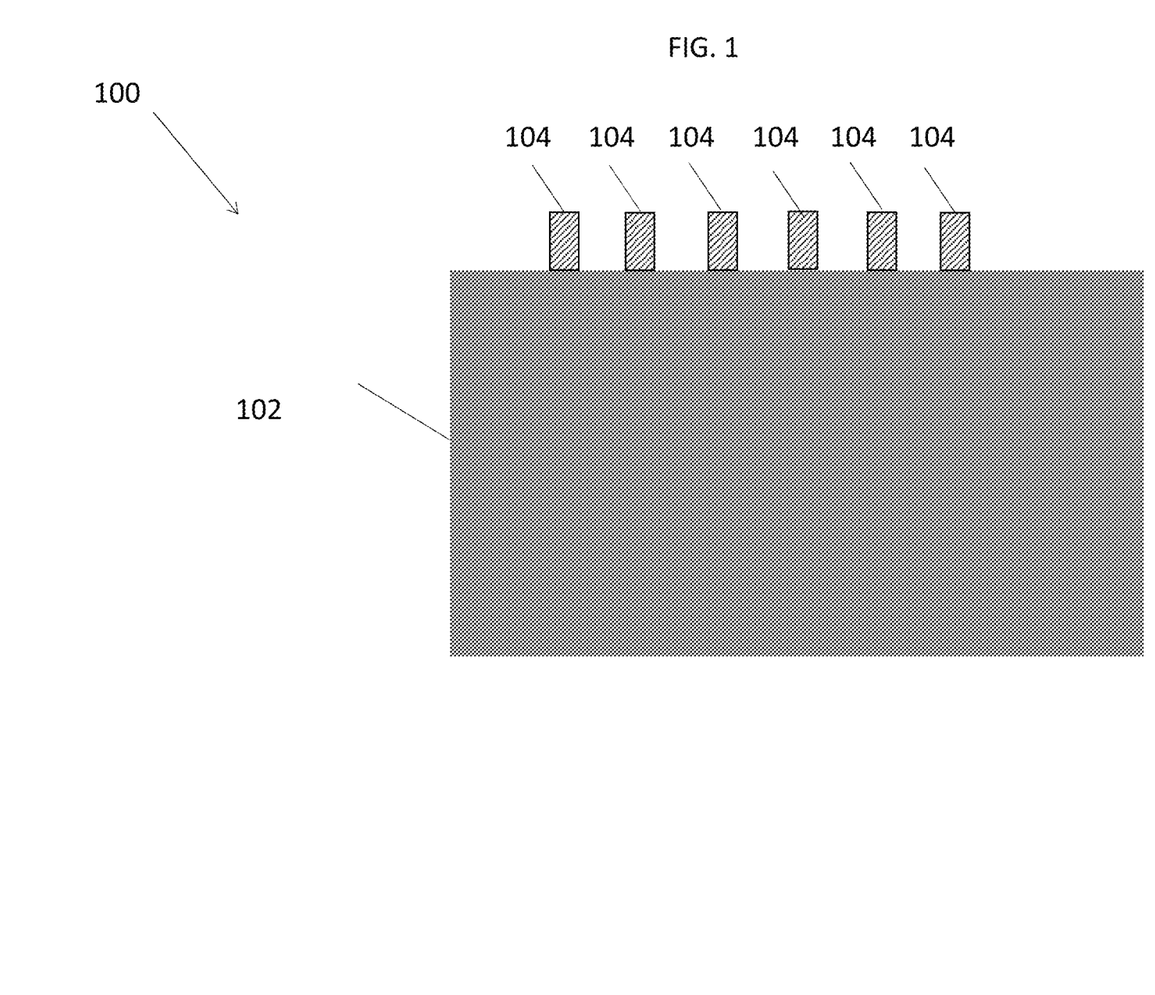
FIG. 1 depicts a side view of a structure from which fins for a finFET device will be formed.

Turning now to a more detailed description of aspects of the present invention, embodiments described here allow the fabrication of finFET semiconductor structures. FIG. 1 illustrates a cross-sectional view of a structure 100 having a substrate 102 during an intermediate operation of a method of fabricating a semiconductor device according to one or more embodiments. The substrate 102 can be of any suitable substrate material such as, for example, monocrystalline Si, SiGe, SiC, or semiconductor-on-insulator (SOI). In some embodiments, a top layer of the substrate 102 can be Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials.

In some embodiments, a hardmask layer is deposited on top of the substrate 102 and patterned such that discrete hardmasks 104 remain. The hardmasks can be of any suitable material, such as silicon nitride SiN and can be referred to herein as a fin hardmask from time to time. In more detail, the fins are formed by forming fin hardmasks 104 on top of a substrate 102 and then performing a reactive ion etching process on the substrate to remove portions of the substrate not covered by the fin hardmask layer 104. Because there is no stop layer on or in the substrate 102, the reactive ion etch process is time based.

Figure 2:
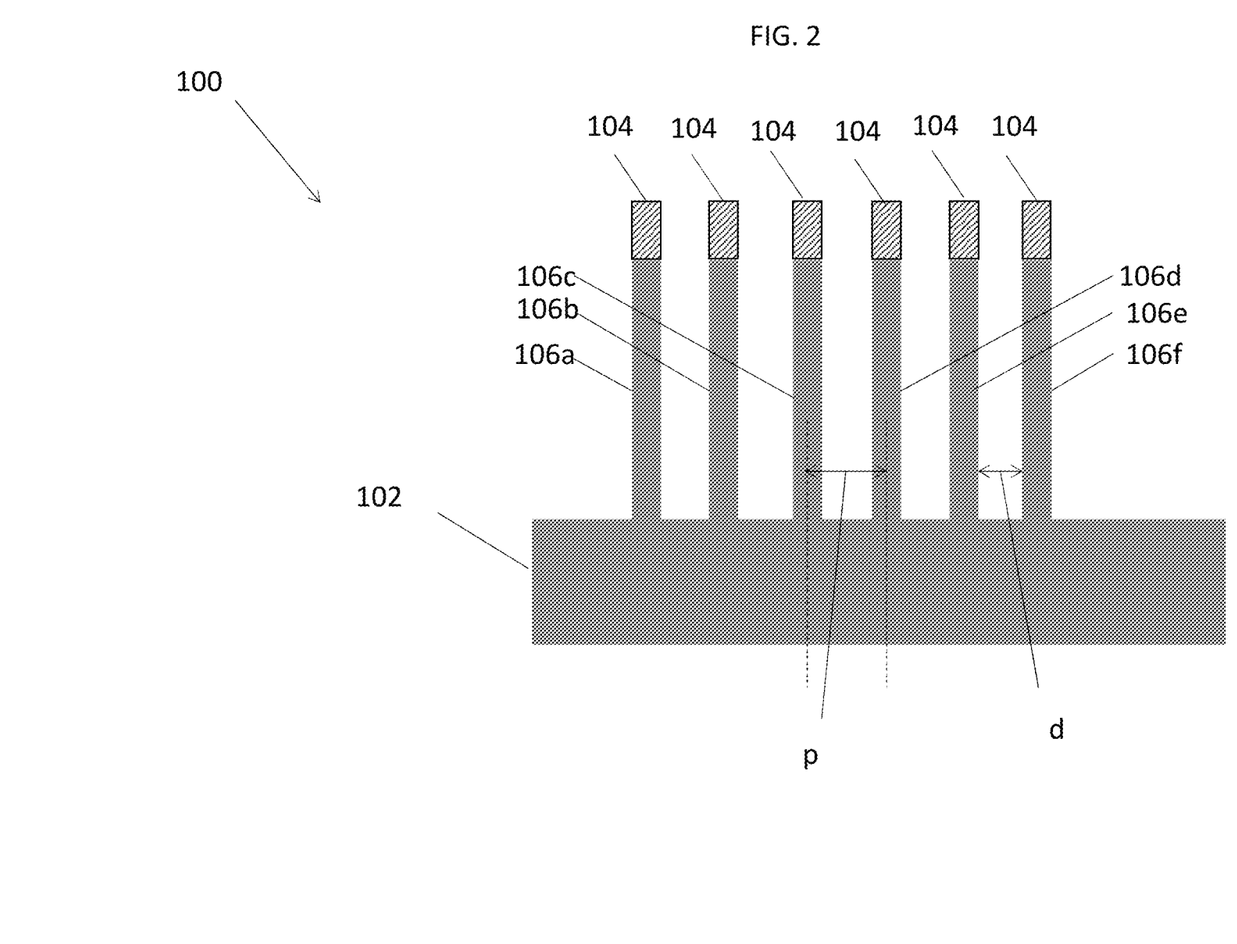
FIG. 2 shows side view of the structure of FIG. 1 after the fins have been formed from a substrate.

FIG. 2 illustrates a cross-sectional view of the structure 100 after the formation of fins 106a, 106b, 106c, 106d, 106e, 106f The fins can be formed by lithography or etching. The lithography can be for example, self-aligned double patterning (SADP) or self-aligned quadruple patterning (SAQP).

The center of each fin 106a-106f is separated from the center of it nearest neighbor by a distance p or "fin pitch". Of course the distance p could be measured from one left edge of a fin to the left edge of its adjacent neighbor in some embodiments. For a particular fin pitch, a distance "d" exists between each adjacent fin. This distance d will define the width of liners formed on sides/tops of groups of fins as further described below.

As illustrated, the fins 106a-106f are formed of the same material as the substrate 102. Of course, in some embodiments, the fins 106a-106f or the substrate 102 could be doped such they are the same as one another.

Figure 3:
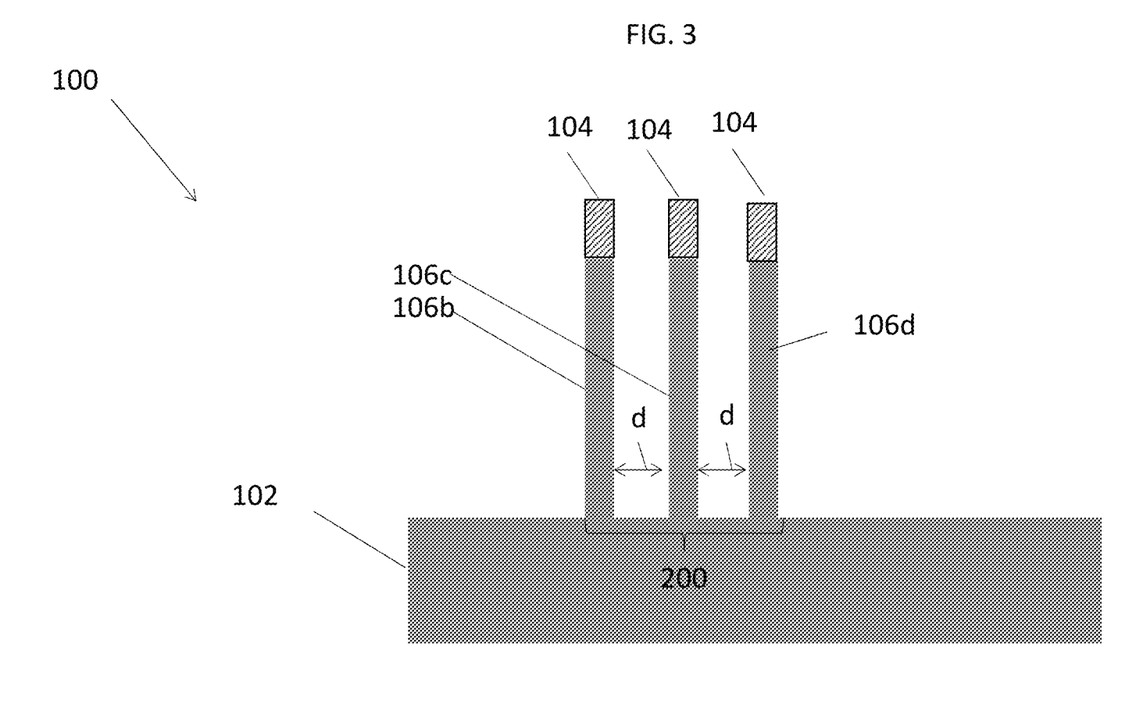
FIG. 3 shows a side view of the structure of FIG. 2 after some of the fins have been removed.

FIG. 3 shows an intermediate structure after one or more of the fins 106a-106f have been removed. In the example shown in FIG. 3, fins 106a, 106d-106f have been removed. The fins 106b, 106c, 106d that remain will be used to form one or more FETs. In the example that follows, fins 106b-106d can form a finFET (generally identified as finFET 200). The finFET can have more than the 3 fins shown in herein.

Figure 7A:
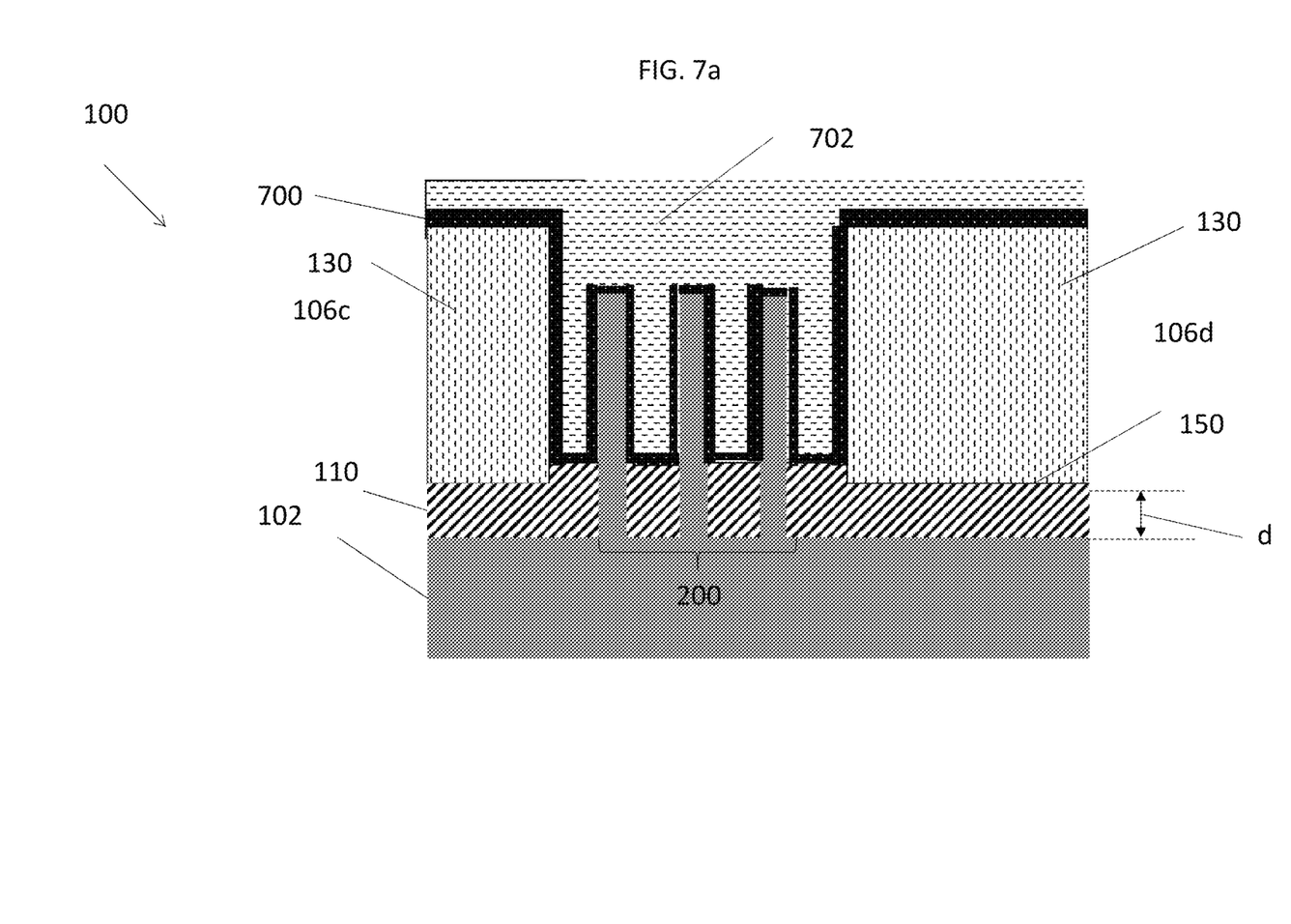
FIG. 7a shows the structure of FIG. 6a after a dielectric layer and a work function metal (WFM) have been deposited over the fins and the STI.
Figure 7B:
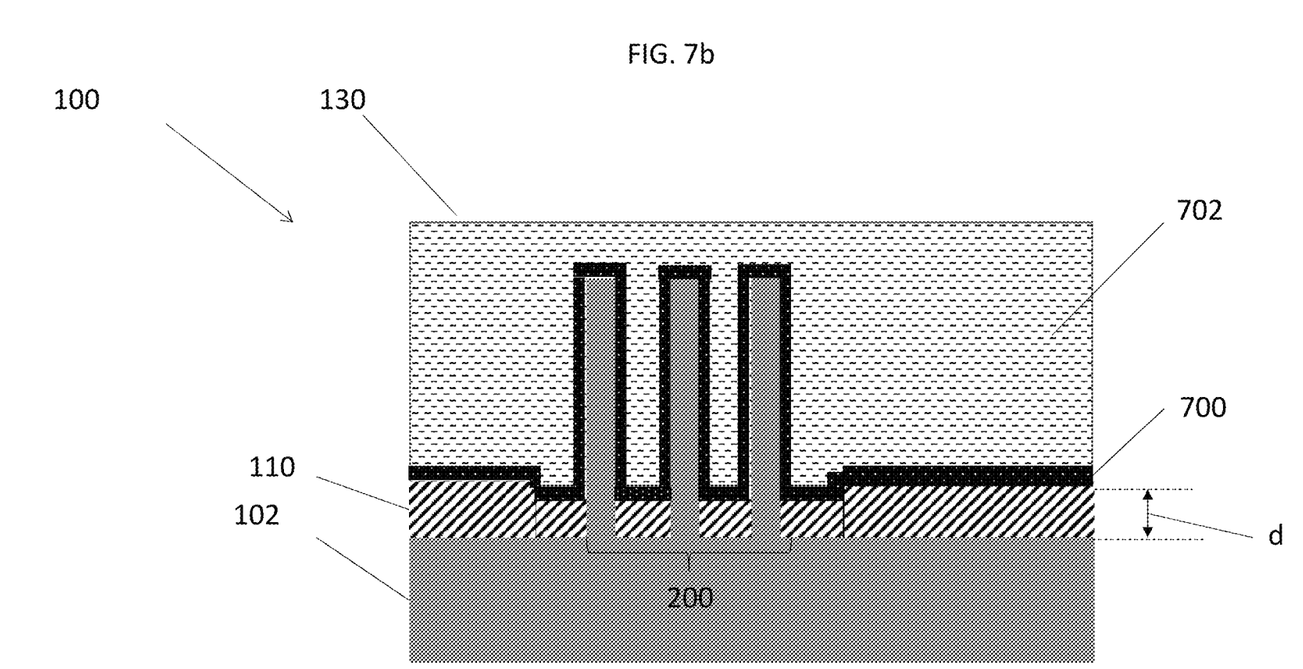
FIG. 7b shows the structure of FIG. 6b after the STI has been removed and a dielectric layer and a work function metal have been deposited over the fins.
Figure 8:
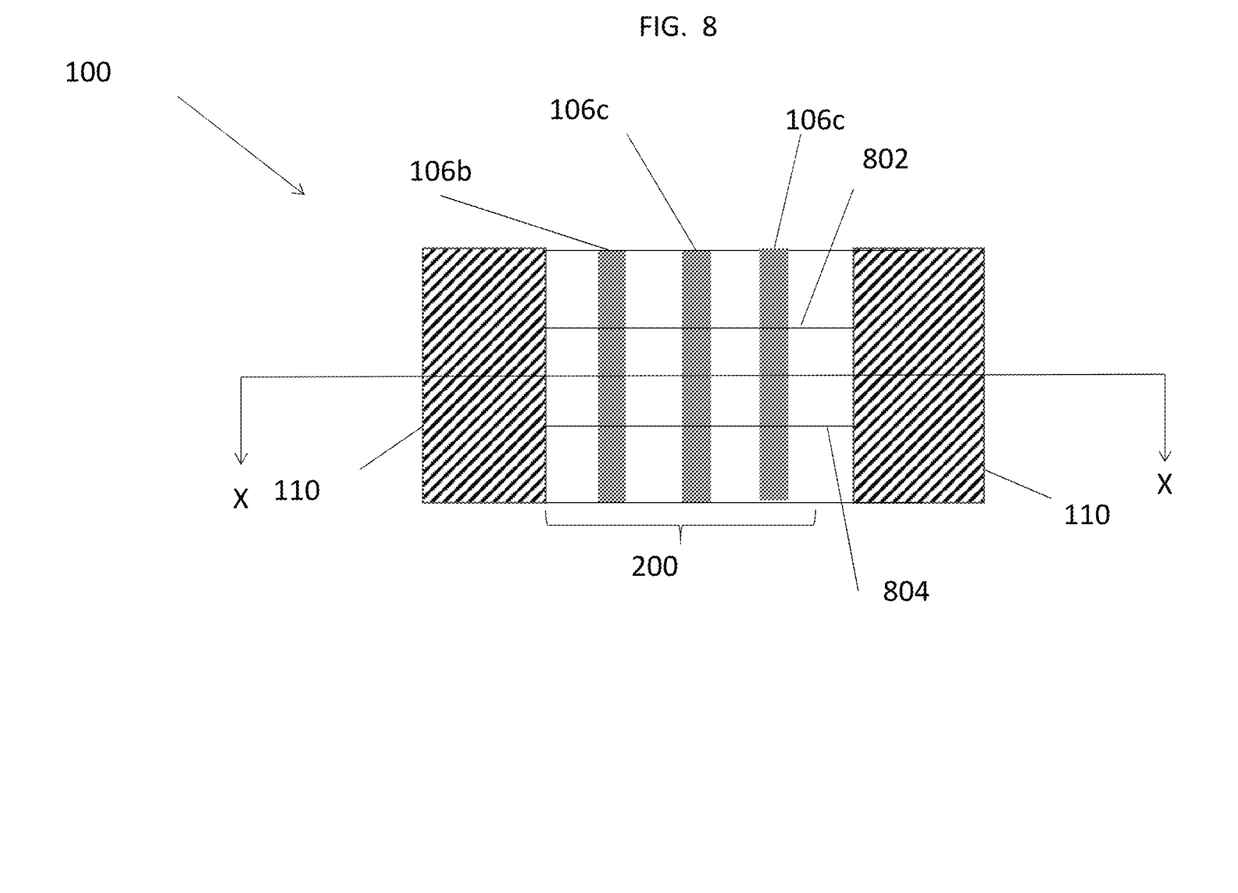
FIG. 8 shows a top view of the workpiece after the spacers have been formed and before the gate stack has been completed.

As illustrated and described herein, the three fins 106b, 106c, 106d will be used to form the source and drain regions of an FET 200, which is shown in greater detail in FIG. 8. The fabrication operations described herein and illustrated in FIGS. 4-7b describe an exemplary process that can be used to form the source and drain regions of the FET 200. The cross-sectional diagrams depicted in FIGS. 4-7b are taken between the gate spacers 802, 804 along line X-X of the FET 200 shown in FIG. 8.

Figure 4:
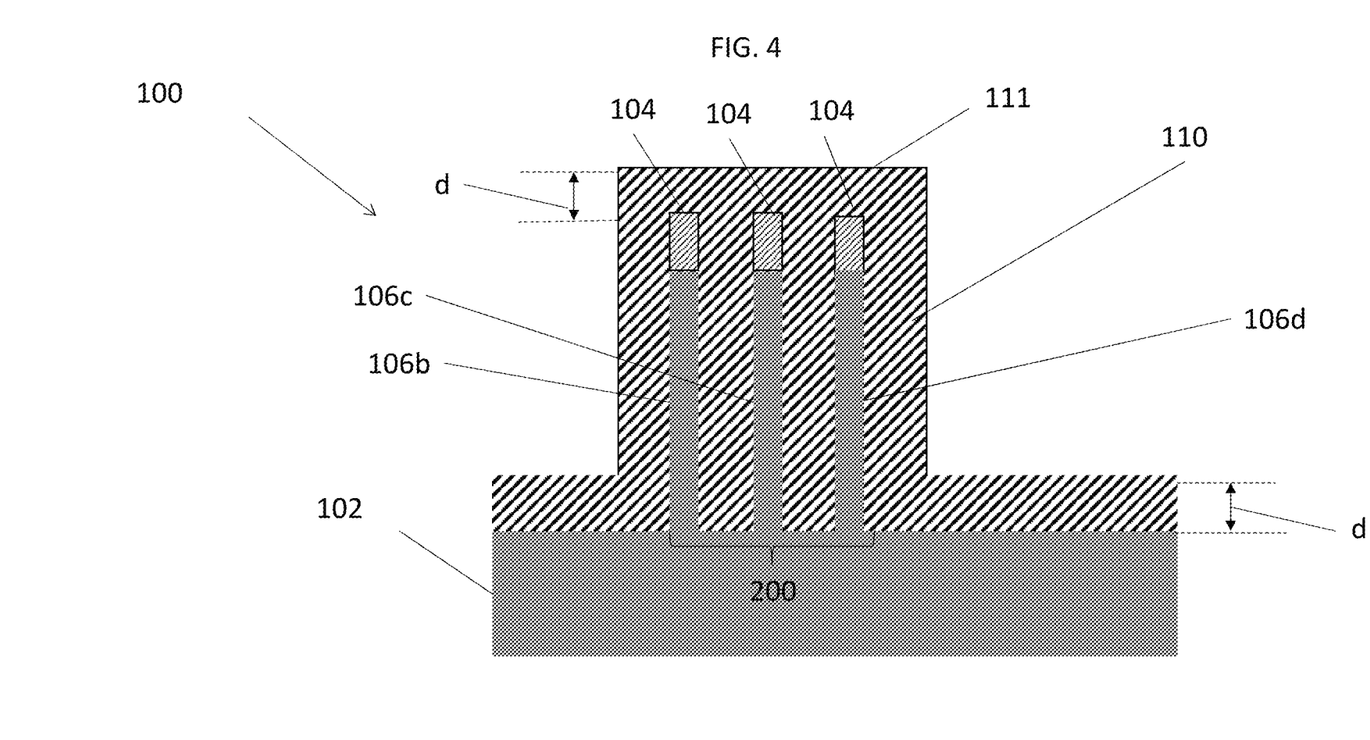
FIG. 4 shows a side view of the structure of FIG. 3 after a first insulating material has been conformally deposited over the fins.

FIG. 4 shows the structure 100 after a first insulating material 110 is conformally deposited over the substrate 102 and between the remaining fins 106. The first insulating material 110 can be an oxide in the embodiment. The first insulating material 110 is generally deposited at a thickness "d" which is the same as the distance that exists between each adjacent fin and can include a top surface 111. The top surface 111 can be deposited such that it is distance "d" above the tops of the hardmasks 104.

Figure 5:
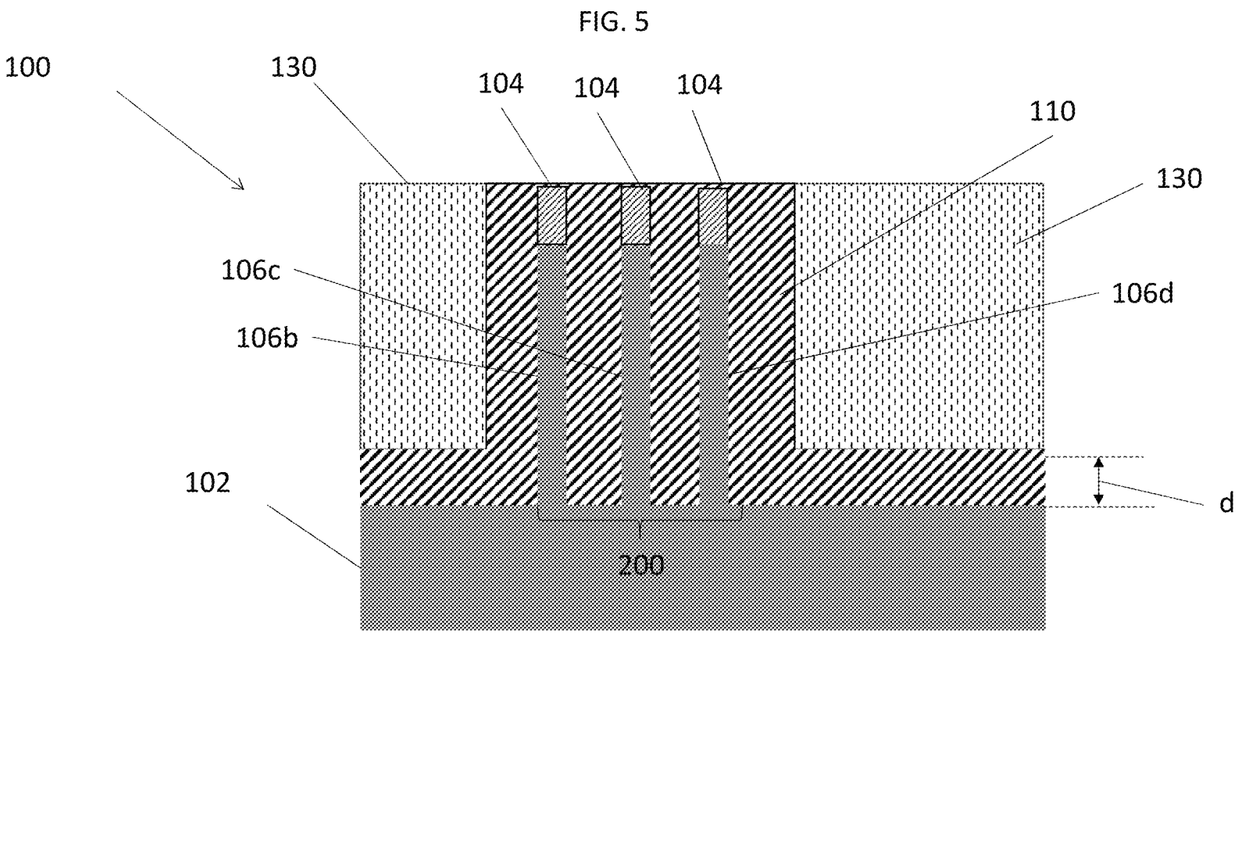
FIG. 5 shows a side view of the structure of FIG. 4 after a shallow trench isolator (STI) has been deposited over the fins and the first insulating material and a chemical-mechanical planarization (CMP) has been performed to reveal tops of the fins.

A second insulator 130 (also referred to as an shallow trench isolator (STI) can then be non-conformally deposited over the structure of FIG. 4 and a CMP process employed to expose tops of the hardmasks 140 as illustrated in FIG. 5. The local STI 130 can be formed of SiCO in one embodiment. As illustrated, the STI 130 is continuous and formed of a single material. It shall be understood that SiCO is not required and the continuous STI 130 could be formed of another material.

FIG. 5 shows the structure 100 after the top surface 111 of the first insulating material 110 has been lowered (e.g., polished back) to reveal the top portions of the fins 106b, 106c, 106e.

Figure 6A:
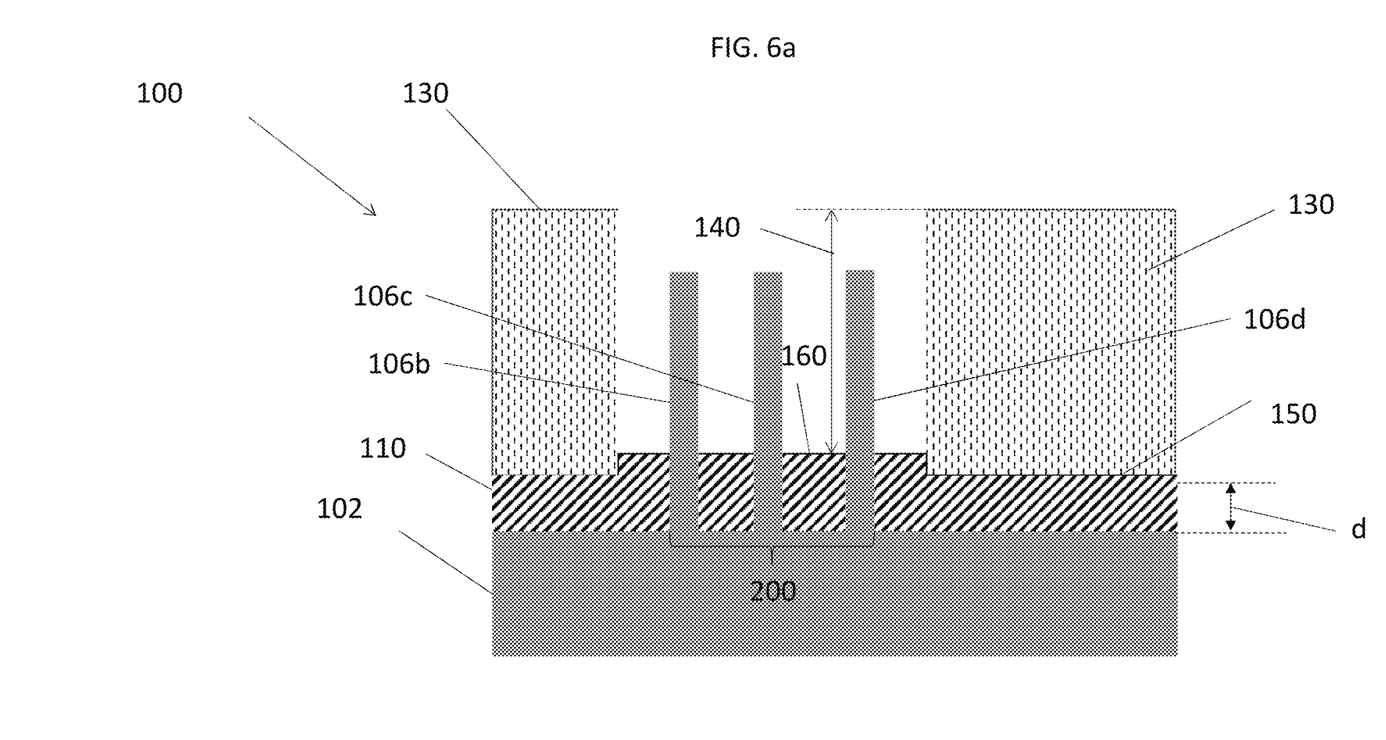
FIG. 6a shows a side view of a structure of FIG. 5 after the top of the first insulating material has been lowered.
Figure 6B:
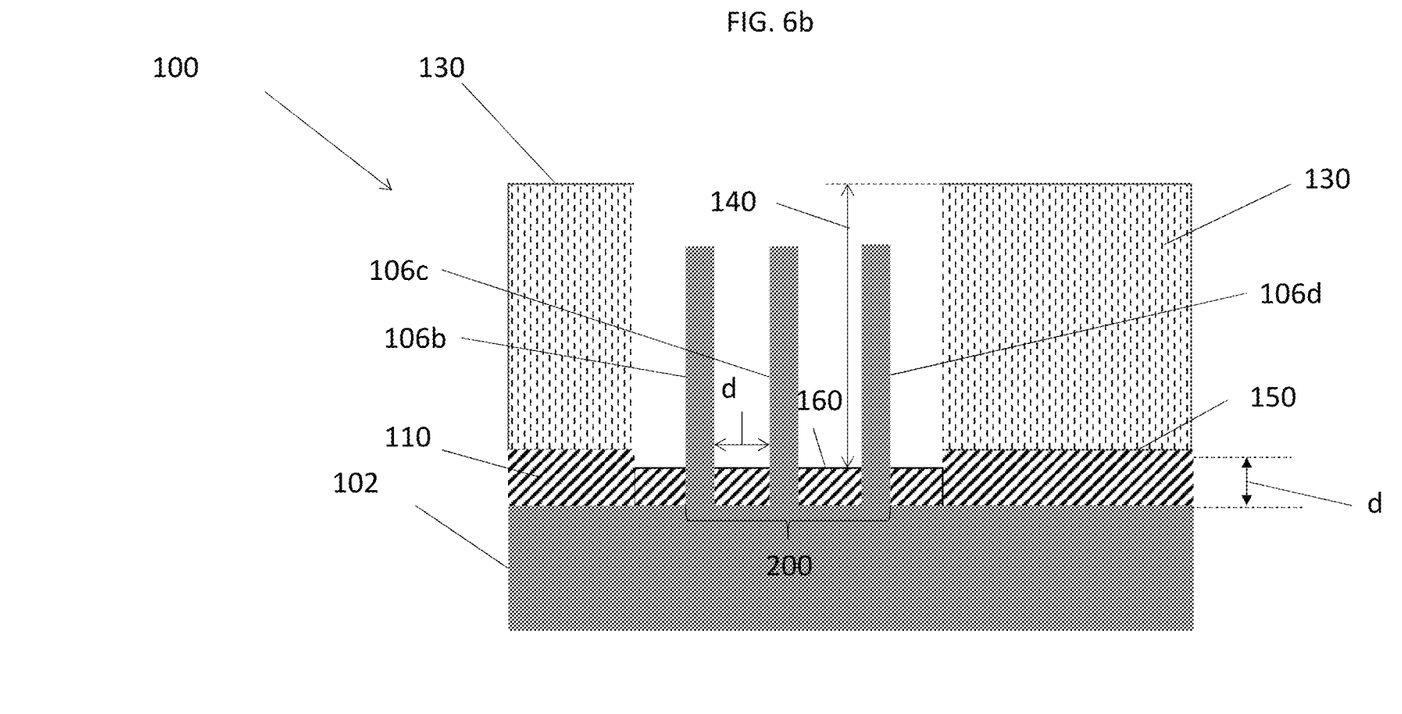

FIGS. 6a and 6b shows the structure 100 after the fins 106b-106d have been revealed by the removal of the first insulating material 110. The removal of the first insulating material 110 can be accomplished by either a wet or dry etch. The removal also includes removing the hardmasks 104 that remained on the top of the fins. It shall be understood the hardmask 104 could be retained in some embodiments. The depth of the first insulating material 110 removal is denoted by depth 140 in FIGS. 6a and 6b and can be controlled in a known manner. As illustrated, the depth 140 in FIG. 6a is such that the upper surface 160 of the first insulating material 110 between the fins 106c and 106d is above a bottom surface 150 of the STI 130. Alternatively, and as illustrated in FIG. 6b, the depth 140 is such that the upper surface 160 of the first insulating material 110 between the fins 106c and 106d is below the bottom surface 150 of the STI 130. In both cases, the STI 130 is continuous.

In either of the embodiments shown in FIG. 6a or 6b, the STI could be removed and then a dielectric layer and work function metal deposited over the fins to form a gate contact.

For simplicity, in FIG. 7a, which is a next processing step after FIG. 6a, only the case where the STI 130 has been retained is illustrated. In FIG. 7a, a dielectric layer 700 is conformally deposited over the fins and STI 130. A gate contact 702 that is formed of a work function metal is then deposited over the dielectric layer 700. In one embodiment, the dielectric layer 700 is formed of a high-k dielectric.

In FIG. 7b, which is a next processing step after FIG. 6b, the case where the STI 130 has been removed is illustrated. It shall be understood, however, that the STI could be retained.

In FIG. 7b, a dielectric layer 700 is conformally deposited over the fins. A gate contact 702 that is formed of a work function metal is then deposited over the dielectric layer 700. In one embodiment, the dielectric layer 700 is formed of a high-k dielectric.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
   forming a plurality of fins that extend vertically from a substrate;
   removing at least one fin to form at least a first group of fins;
   forming a fin hardmask on top of a substrate and the fins;
   conformally depositing a first insulating material layer on the first group of fins and the substrate, wherein the conformally deposited first insulating material layer has a vertical thickness measured vertically from the fin hardmask equal to a horizontal distance between adjacent fins in the first group of fins;

forming a second insulator over the first insulating material layer such that the first insulating material layer separates the second insulating material from the substrate;

removing the second insulator to reveal the tops of the first group of fins;

removing the first insulating material layer between the fins and the second insulating material;

forming a dielectric layer over the fins; and forming a work function metal over the dielectric layer.

2. The method of claim 1, wherein forming the fins includes:

performing a reactive ion etching (REI) process on the substrate to remove portions of the substrate not covered by the fin hardmask.

3. The method of claim 1 further comprising:

removing the second insulating material includes performing a chemical-mechanical planarization (CMP) to level the second insulating material and the fin hardmask.

4. The method of claim 1 further comprising:

removing the second insulating material over the first insulating material layer before depositing the dielectric layer.

5. The method of claim 1, wherein the dielectric is deposited over the second insulating material.

6. A method for forming a gate of a fin Field Effect Transistor (finFET), the method comprising:

forming a plurality of fins that extend vertically from a substrate;

removing at least one fin to form at least a first group of fins;

forming a fin hardmask on top of a substrate and the fins;

conformally depositing a first insulating material layer on the first group of fins and the substrate, wherein the conformally deposited first insulating material layer has a vertical thickness measured vertically from the fin hardmask equal to a distance between adjacent fins in the first group of fins;

forming a second insulating material layer over the first insulating material layer such that the first insulating material layer separates the second insulating material from the substrate;

removing a portion of the second insulating material layer to reveal the tops of the first group of fins;

removing the first insulating material between the fins and the second insulating material;

forming a dielectric layer over the fins; and forming a work function metal over the dielectric layer.

7. The method of claim 6, wherein forming the fins includes:

performing a reactive ion etching (REI) process on the substrate to remove portions of the substrate not covered by the fin hardmask.

8. The method of claim 6, further comprising:

removing the second insulating material includes performing a chemical-mechanical planarization (CMP) to level the second insulating material and the fin hardmask.

9. The method of claim 6 further comprising:

removing the second insulating material over the first insulating material layer before depositing the dielectric layer.

10. The method of claim 6, wherein the dielectric is deposited over the second insulating material.

* * * * *